United States Patent
Inoue et al.

(10) Patent No.: US 10,984,949 B2
(45) Date of Patent: Apr. 20, 2021

(54) RESIN MOLDED SUBSTRATE AND MOUNTING STRUCTURE FOR CAPACITOR

(71) Applicant: FANUC CORPORATION, Yamanashi (JP)

(72) Inventors: Yuuki Inoue, Yamanashi (JP); Masaya Tateda, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 16/831,641

(22) Filed: Mar. 26, 2020

(65) Prior Publication Data

US 2020/0227206 A1    Jul. 16, 2020

Related U.S. Application Data

(62) Division of application No. 16/136,425, filed on Sep. 20, 2018, now abandoned.

(30) Foreign Application Priority Data

Nov. 21, 2017   (JP) .................................. 2017-223464

(51) Int. Cl.
| | |
|---|---|
| *H05K 1/18* | (2006.01) |
| *H01G 2/06* | (2006.01) |
| *H05K 3/30* | (2006.01) |

(52) U.S. Cl.
CPC .............. *H01G 2/065* (2013.01); *H05K 1/184* (2013.01); *H05K 3/306* (2013.01);
(Continued)

(58) Field of Classification Search
CPC .......... H01G 2/065; H01G 2/06; H05K 3/306; H05K 1/184; H05K 2201/09045;
(Continued)

(56) References Cited

U.S. PATENT DOCUMENTS

| | | | | |
|---|---|---|---|---|
| 3,439,233 | A | * | 4/1969 | Braiman ................... H01G 2/06 361/535 |
| 5,880,926 | A | | 3/1999 | Nishino et al. |

(Continued)

FOREIGN PATENT DOCUMENTS

| | | |
|---|---|---|
| JP | S53-109060 U | 9/1978 |
| JP | S62-28472 U | 2/1987 |

(Continued)

OTHER PUBLICATIONS

An Office Action mailed by the Japanese Patent Office dated Jun. 18, 2019, which corresponds to Japanese Patent Application No. 2017-223464 and is related to U.S. Appl. No. 16/136,425.

(Continued)

*Primary Examiner* — Ishwarbhai B Patel
(74) *Attorney, Agent, or Firm* — Studebaker & Brackett PC

(57) ABSTRACT

A resin molded substrate has at least a pair of terminal through holes for allowing lead terminals of a cylindrical capacitor to be inserted through, and at least one protrusion for supporting a side of a bottom portion of the capacitor so as to space from a front surface of the substrate the side of the bottom portion of the capacitor having the lead terminals inserted through the terminal through holes. The pair of lead terminals at the bottom portion are inserted through the terminal through holes of the resin molded substrate, whereby the capacitor is mounted in an upright state with a solder, so that the protrusion spaces the side of the bottom portion from the front surface of the resin molded substrate.

2 Claims, 11 Drawing Sheets

(52) U.S. Cl.
CPC ............. *H05K 2201/09045* (2013.01); *H05K 2201/09118* (2013.01); *H05K 2201/10015* (2013.01); *H05K 2201/10454* (2013.01); *H05K 2201/10583* (2013.01); *H05K 2201/10651* (2013.01); *H05K 2201/2036* (2013.01)

(58) Field of Classification Search
CPC . H05K 2201/2036; H05K 2201/09118; H05K 2201/10454; H05K 2201/10583; H05K 2201/10651; H05K 2201/10015
See application file for complete search history.

(56) References Cited

U.S. PATENT DOCUMENTS

| | | | |
|---|---|---|---|
| 6,012,223 | A | 1/2000 | Hinze |
| 2007/0218257 | A1 | 9/2007 | Ambo |
| 2008/0259580 | A1 | 10/2008 | Stillabower et al. |
| 2016/0270230 | A1 | 9/2016 | Mercier et al. |

FOREIGN PATENT DOCUMENTS

| | | | |
|---|---|---|---|
| JP | H01-171024 U | | 12/1989 |
| JP | H04-63674 U | | 5/1992 |
| JP | H05-13892 A | | 1/1993 |
| JP | H08-321669 A | | 12/1996 |
| JP | 2000-196215 A | | 7/2000 |
| JP | 2001-135920 A | | 5/2001 |
| JP | 2005-302929 A | | 10/2005 |
| JP | 2011-061125 A | | 3/2011 |
| JP | 2014-192175 A | | 10/2014 |
| JP | 2015-179710 A | | 10/2015 |
| JP | 603688 B2 | | 3/2017 |
| JP | 6118995 B2 | | 4/2017 |
| WO | 97/01263 A1 | | 1/1997 |
| WO | 2012/098573 A1 | | 7/2012 |

OTHER PUBLICATIONS

An Office Action mailed by China National Intellectual Property Administration dated Aug. 4, 2020, which corresponds to Chinese Patent Application No. 201811369521.9 and is related to U.S. Appl. No. 16/831,641 with English language translation.

\* cited by examiner

RESIN MOLDED SUBSTRATE AND MOUNTING STRUCTURE FOR CAPACITOR

This application is a Divisional of U.S. patent application Ser. No. 16/136,425 filed on Sep. 20, 2018, now abandoned, which is based on and claims the benefit of priority from Japanese Patent Application No. 2017-223464, filed on 21 Nov. 2017, the content of which is incorporated herein by reference.

BACKGROUND OF THE INVENTION

Field of the Invention

The present invention relates to a resin molded substrate and a mounting structure for a capacitor.

Related Art

As a method of mounting a plurality of electronic components on the front surface of a substrate, the method (flow soldering) is known in which molten solder in a solder bath is jetted upwardly toward the back surface of the substrate, to simultaneously solder the lead terminals of the plurality of electronic components inserted through the terminal through holes of the substrate. The molten solder infiltrates into the terminal through holes along the protruding lead terminals on the back surface of the substrate, thereby simultaneously enabling to electrically connect the plurality of electronic components and fix the electronic components to the substrate. The amount of the solder infiltrating into the terminal through holes along the lead terminals is normally adjusted by adjustment of jet flow in the solder bath, thereby preventing solder from excessively infiltrating into the terminal through holes and overflowing on the front surface of the substrate.

A resin molded substrate when used as a substrate has the problem that it is difficult to completely prevent solder from overflowing on the front surface of the substrate. A normal resin molded substrate has a plurality of reinforcing ribs protruding on the back surface thereof, and the ribs obstruct the flow of the solder jetted onto the back surface of the substrate. Accordingly, it is difficult to adjust jet flow in a solder bath so that the solder does not overflow on the front surface of the substrate.

In a process of mounting an electronic component, the presence/absence of excessive solder having overflowed on the front surface of a substrate and the state of the solder (whether or not the solder short-circuits lead terminals) are checked after completion of soldering. However, a capacitor when used as an electronic component has the problem that it is difficult to confirm the state of the solder on the front surface of the substrate, as described below.

FIG. 9 shows the state in which a cylindrical capacitor C is mounted on a resin molded substrate 100. The capacitor C has a pair of lead terminals C2, C2 at a bottom portion C1. The lead terminals C2, C2 are inserted through a pair of terminal through holes 101, 101 of the resin molded substrate 100, and are soldered with a solder S adhering to lands 102, 102 on the back surface of the substrate, so that the capacitor C is mounted in an upright state. In general, the bottom portion C1 of the cylindrical capacitor C is recessed more than a peripheral portion C3 in the side of the bottom portion C1. Therefore, even if the lead terminals C2, C2 are short-circuited by an excessive solder S1 having overflowed on the front surface of the resin molded substrate 100, the solder S1 is not visually checked from the outside because the solder S1 is confined in the space surrounded by the recessed bottom portion C1 and the resin molded substrate 100. X-ray analysis is required in order to check the state of the confined solder S1. Thus, there is a problem that equipment for the X-ray analysis and inspection man-hours are required.

Patent Document 1 discloses the conventional technique, in which a terminal of an electronic component has an inverted V-shaped regulating portion having resiliency at the tip thereof to be brought into contact with the front surface of a substrate, and the electronic component is mounted to be spaced from the front surface of the substrate by the regulating portion. In the present technique, the resiliency of the regulating portion absorbs thermal expansion and contraction in the thickness direction of the substrate caused by heat, thereby preventing a crack from occurring at the soldered portion of the terminal. The present technique solves none of the problems described above in the case where a capacitor is mounted on a resin molded substrate. There is another problem that since the regulating portion is disposed at the terminal between the electronic component and the front surface of the substrate, the solder having overflowed on the front surface of the substrate spreads in the lateral direction on the front surface of the substrate along the regulating portion, so that a short circuit easily occurs between the terminals. In addition, the present technique requires a special processing of disposing the regulating portion to the terminal of the electronic component.

Each of Patent Document 2 and Patent Document 3 discloses a technique of mounting a plurality of capacitors on the front surface of a substrate. The object of these techniques is to mount the capacitors laid laterally on the front surface of the substrate. The techniques solve none of the problems described above in the case where a capacitor is mounted in an upright state on the front surface of a substrate.

Patent Document 1: Japanese Unexamined Utility Model Application, Publication No. S53-109060
Patent Document 2: Japanese Patent No. 6103688
Patent Document 3: Japanese Patent No. 6118995

SUMMARY OF THE INVENTION

The present invention has been made in view of the above-described conventional circumstances. The object of the present invention is to provide a resin molded substrate and a mounting structure for a capacitor, allowing to easily check the presence/absence of solder on the front surface of the substrate on which the capacitor is mounted and the state of the solder, without processing the capacitor itself.

(1) A resin molded substrate according to the present invention (for example, a resin molded substrate 1 described below) allows a cylindrical capacitor (for example, a capacitor C described below) to be mounted in an upright state with solder (for example, a solder S described below), and the capacitor has a pair of lead terminals (for example, lead terminals C2 described below) at a bottom portion (for example, a bottom portion C1 described below). The resin molded substrate has at least a pair of terminal through holes (for example, terminal through holes 2 described below) for allowing the lead terminals of the capacitor to be inserted through, respectively, and at least one protrusion (for example, a protrusion 4 described below) for spacing the capacitor from a front surface (for example, a front surface 1a described below) of the substrate, under being in contact with a side of the bottom portion of the capacitor having the lead terminals inserted through the terminal through holes.

(2) In the resin molded substrate according to (1), the protrusion may be disposed so as to be brought into contact with a peripheral portion (for example, a peripheral portion C3 described below) in the side of the bottom portion of the capacitor.

(3) In the resin molded substrate according to (1) or (2), the protrusion may be disposed between the pair of terminal through holes.

(4) In the resin molded substrate according to (1) or (2), the protrusion may be disposed so as to overlap at least one of the pair of terminal through holes, and the terminal through hole overlapped by the protrusion may penetrate the protrusion.

(5) In the resin molded substrate according to any one of (1) to (4), the protrusion may be an integrally-molded portion integrally molded on the front surface of the substrate.

(6) A mounting structure for a capacitor according to the present invention allows a cylindrical capacitor (for example, a capacitor C described below) to be mounted in an upright state on a resin molded substrate with solder, and the capacitor has a pair of lead terminals (for example, lead terminals C2 described below) at a bottom portion (for example, a bottom portion C1 described below). The resin molded substrate is the resin molded substrate (for example, a resin molded substrate 1 described below) according to any one of (1) to (5). The lead terminals are inserted through the terminal through holes (for example, the terminal through holes 2 described below) of the resin molded substrate, and the side of the bottom portion (for example, the bottom portion C1 described below) of the capacitor is brought into contact with the at least one protrusion (for example, the protrusion 4 described below) of the resin molded substrate, so that the capacitor is mounted to be spaced from the front surface (for example, the front surface 1a described below) of the resin molded substrate.

The present invention enables to provide a resin molded substrate and a mounting structure for a capacitor allowing to easily check the presence/absence of solder on the front surface of the substrate on which the capacitor is mounted and the state of the solder, without processing the capacitor itself.

DETAILED DESCRIPTION OF THE INVENTION

Some embodiments of the present invention will be described below with reference to the drawings.

First Embodiment

Figure 1:
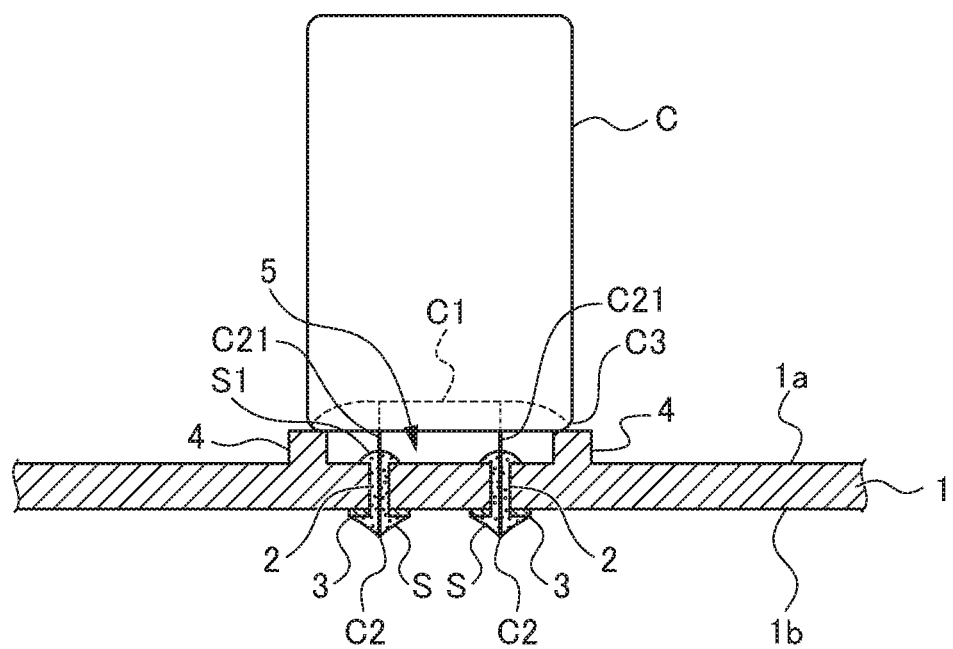
FIG. 1 is a diagram illustrating a mounting structure for a capacitor by use of a resin molded substrate according to a first embodiment of the present invention.
Figure 2:
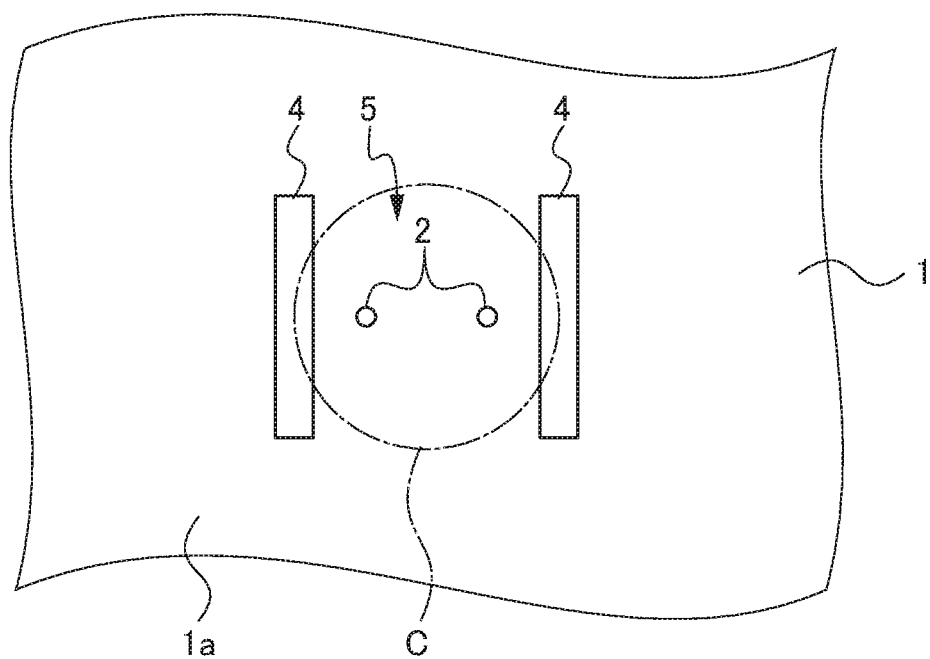
FIG. 2 is a partial plan view illustrating the resin molded substrate according to the first embodiment of the present invention.

FIG. 1 is a diagram illustrating a mounting structure for a capacitor by use of a resin molded substrate according to a first embodiment of the present invention. FIG. 2 is a partial plan view illustrating the resin molded substrate according to the first embodiment of the present invention. A resin molded substrate 1 according to the present invention is a substrate allowing a capacitor C to be mounted with a solder S as shown in FIG. 1 and FIG. 2. The resin molded substrate 1 has a pair of terminal through holes 2, 2 for allowing a pair of lead terminals C2, C2 of the capacitor C to be inserted through, and lands 3, 3 respectively corresponding to the terminal through holes 2, 2 on a back surface 1b of the resin molded substrate 1.

The capacitor C formed in a cylindrical shape has the pair of lead terminals C2, C2 extending from a bottom portion C1. The bottom portion C1 is recessed more than a peripheral portion C3 in the side of the bottom portion C1 of the capacitor C. The lead terminals C2, C2 are respectively inserted into the terminal through holes 2, 2, and the molten solder in a solder bath not shown is jetted upwardly toward the resin molded substrate 1 from the side of the back surface 1b of the resin molded substrate 1, whereby the solder S adheres to the peripheries of the lead terminals C2, C2 protruding from the lands 3, 3. The solder S adhering to the lands 3, 3 electrically connects the lead terminals C2, C2 and the lands 3, 3, respectively. Simultaneously with the connection, the capacitor C is fixed on the resin molded substrate 1 with the solder S infiltrated into the terminal through holes 2, 2 so as to be mounted in an upright state on a front surface 1a of the resin molded substrate 1.

A pair of protrusions 4, 4 are disposed on the front surface 1a of the resin molded substrate 1. The protrusions 4, 4 are disposed on both end sides in the arrangement direction (horizontal direction in FIG. 1 and FIG. 2) of the pair of terminal through holes 2, 2. The protrusions 4, 4 extend mutually in parallel along the direction (vertical direction in FIG. 2) orthogonal to the arrangement direction of the terminal through holes 2, 2. The pair of terminal through holes 2, 2 are opened between the pair of protrusions 4, 4.

The protrusions 4, 4 are brought into contact with the peripheral portion C3 in the side of the bottom portion C1 of the capacitor C to be mounted on the resin molded substrate 1, thereby supporting the capacitor C. Therefore, the side of the bottom portion C1 of the capacitor C is spaced from the front surface 1a of the resin molded substrate 1 by a distance corresponding to the height of the protrusions 4, 4, whereby a space 5 visible from the outside is formed between the pair of protrusions 4, 4. Root portions C21, C21 of the lead terminals C2, C2 existing on the front surface 1a of the resin molded substrate 1 are exposed in the space 5 between the capacitor C and the resin molded substrate 1. Accordingly, the resin molded substrate 1 and the mounting structure for the capacitor C makes the peripheries of the root portions C21, C21 of the lead terminals C2, C2 of the capacitor C visible from the outside, thereby enabling to easily check the presence/absence of an excessive solder S1 having overflowed on the front surface 1a of the resin molded substrate 1 from the terminal through holes 2, 2 along the lead terminals C2, C2, and the state of the solder S1. This structure requires no processing for spacing the capacitor C and the resin molded substrate 1, to the lead terminals C2, C2 of the capacitor C.

The capacitor C is placed on the upper end surfaces of the protrusions 4, 4 while being spaced apart from the front surface 1a of the resin molded substrate 1, thereby being stably mounted on the resin molded substrate 1. The protrusions 4, 4 support the peripheral portion C3 in the side of the bottom portion C1 which is a relatively hard portion in the capacitor C, so that the capacitor C is mounted on the resin molded substrate 1 in a stable state. Accordingly, the resin molded substrate 1 and the mounting structure for the capacitor C is suitably applicable also to a circuit board to be mounted on a vibrating portion, for example, a drive circuit of a motor.

The protrusions 4, 4 may be disposed on the both sides (the upper side and the lower side in FIG. 2) along the arrangement direction of the lead terminals C2, C2. However, as in the present embodiment, the protrusions 4, 4 are preferably disposed on the both end sides in the arrangement direction of the lead terminals C2, C2. This configuration allows simultaneous visual check of the root portions C21, C21 of the two lead terminals C2, C2 from the direction orthogonal to the arrangement direction of the lead terminals C2, C2, thereby enabling to easily check the presence/absence of a short circuit between the lead terminals C2, C2 caused by the excessive solder S1.

Figure 3:
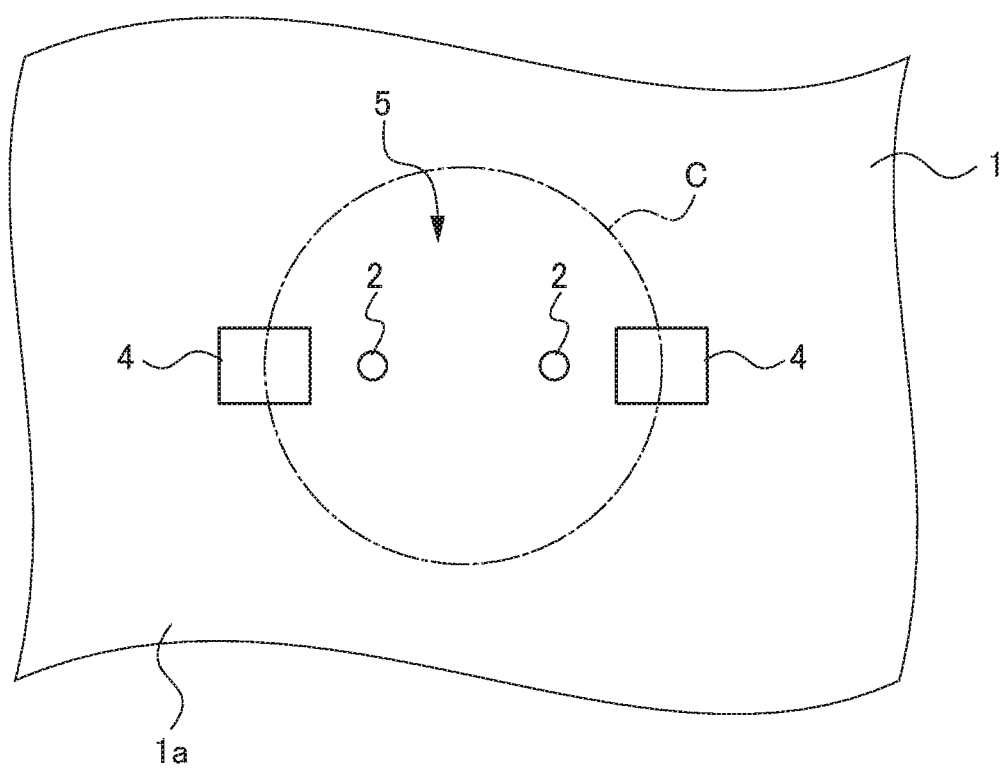
FIG. 3 is a partial plan view illustrating another form of the protrusions of the resin molded substrate according to the first embodiment of the present invention.

It is noted that the pair of protrusions 4, 4 may not necessarily be disposed in parallel. The protrusions 4, 4 are not limited to protrusions each having a long length, and may be formed so as to partially support the peripheral portion C3 in the side of the bottom portion C1 of the capacitor C as shown in FIG. 3. In this case, the protrusions 4, 4 and the peripheral portion C3 of the capacitor C are substantially brought into point contact with each other, thereby further facilitating visual check of the root portions C21, C21 of the lead terminals C2, C2.

The protrusion 4 of the present embodiment is not limited to the one pair of protrusions 4, 4 provided on the front surface 1a of the resin molded substrate 1 for one capacitor C. Only either one of the protrusions 4, 4 may be provided. Alternatively, three or more protrusions 4 may be provided on the front surface 1a of the resin molded substrate 1 as long as the lead terminals C2, C2 are able to be visually checked from the outside.

Second Embodiment

Figure 4:
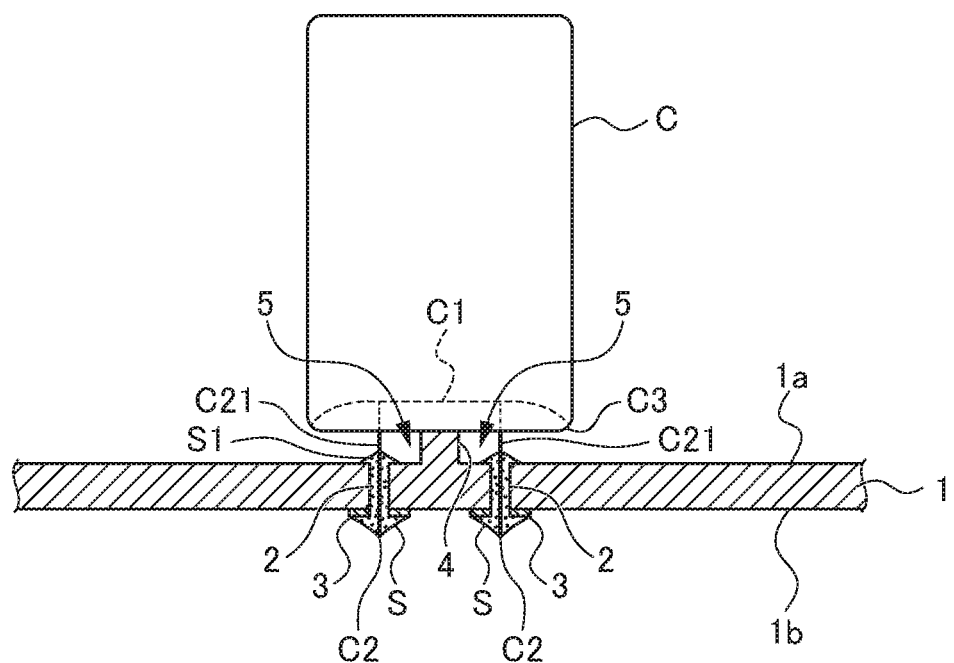
FIG. 4 is a diagram illustrating a mounting structure for a capacitor by use of a resin molded substrate according to a second embodiment of the present invention.
Figure 5:
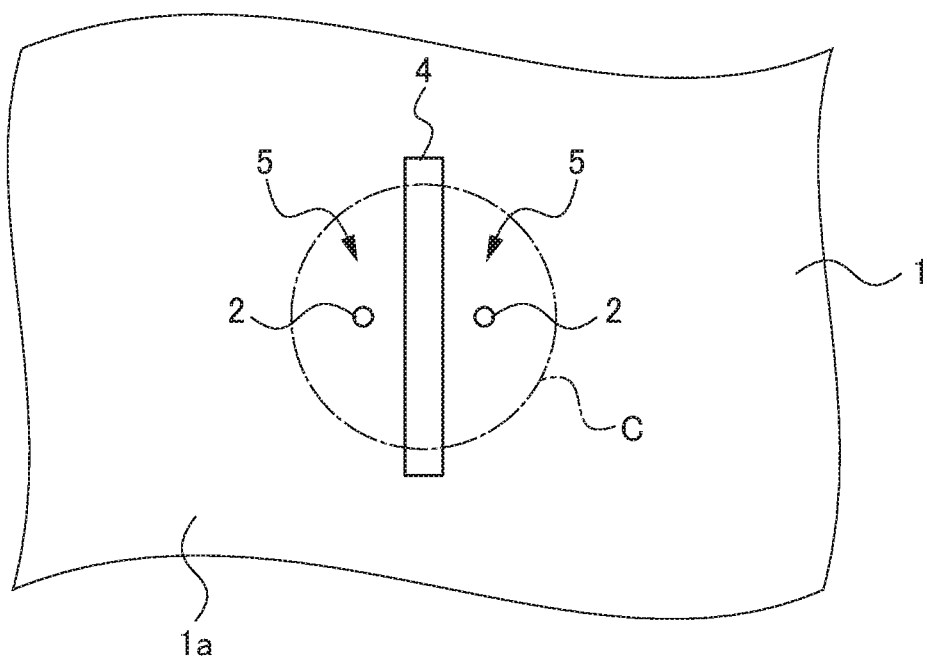
FIG. 5 is a partial plan view illustrating the resin molded substrate according to the second embodiment of the present invention.

FIG. 4 is a diagram illustrating a mounting structure for a capacitor by use of a resin molded substrate according to a second embodiment of the present invention. FIG. 5 is a partial plan view illustrating the resin molded substrate according to the second embodiment of the present invention. Since the portions imparted with the same reference numerals as those in FIG. 1 to FIG. 3 have the same configurations, the above descriptions of those are made reference to as the descriptions of the portions and such descriptions will be omitted in this part. The configurations different from those of the first embodiment are described below. The resin molded substrate 1 according to the second embodiment has only one protrusion 4 for the pair of terminal through holes 2, 2. The protrusion 4 is disposed between the terminal through holes 2, 2 so as to extend in the direction (vertical direction in FIG. 5) orthogonal to the arrangement direction (horizontal direction in FIG. 4 and FIG. 5) of the terminal through holes 2, 2.

The protrusion 4 having a length longer than the outer diameter of the capacitor C is brought into contact with the peripheral portion C3 in the side of the bottom portion C1 of the capacitor C to be mounted on the resin molded substrate 1, thereby supporting the capacitor C. Therefore, the side of the bottom portion C1 of the capacitor C is spaced from the front surface 1a of the resin molded substrate 1 by a distance corresponding to the height of the protrusion 4, whereby spaces 5, 5 visible from the outside are respectively formed between the side of the bottom portion C1 of the capacitor 1 and the resin molded substrate 1 and on the both sides of the protrusion 4. The root portions C21, C21 of the lead terminals C2, C2 existing on the front surface 1a of the resin molded substrate 1 are exposed in the spaces 5, 5, respectively, and are thus visible from the outside. In the same way as the first embodiment, this resin molded substrate 1 and this mounting structure for the capacitor C allows to easily check the presence/absence of the excessive solder S1 having overflowed on the front surface 1a of the resin molded substrate 1 and the state of the solder S1.

The respective spaces 5, 5 are widely opened in the arrangement direction of the lead terminals C2, C2, thereby further facilitating visual check of the peripheries of the root portions C21, C21 of the respective lead terminals C2, C2 as compared with the case in the first embodiment. Since the protrusion 4 is disposed between the root portions C21, C21, the lead terminals C2, C2 are hardly short-circuited to each other even if the excessive solder S1 overflows on the front surface 1a of the resin molded substrate 1, whereby insulation is more easily secured between the lead terminals C2, C2 as compared with the case in the first embodiment.

The length of the protrusion 4 of the present embodiment may be equal to or less than the outer diameter of the capacitor C. In this case, since the protrusion 4 may be brought into contact with the recessed bottom portion C1 of the capacitor C, the height of the protrusion 4 needs to be designed in consideration of the depth of the bottom portion C1.

Third Embodiment

Figure 6:
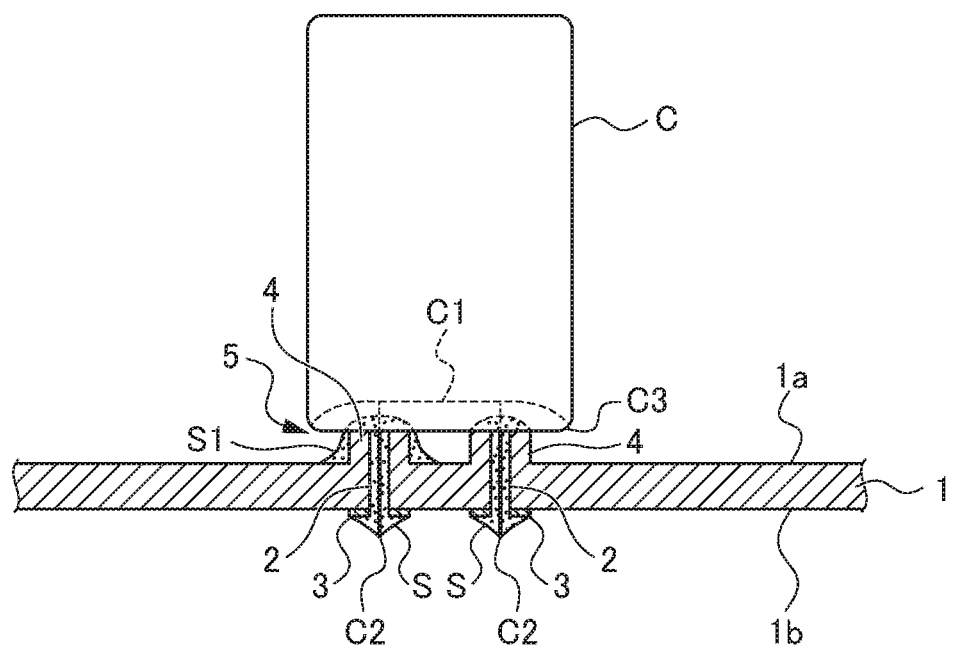
FIG. 6 is a diagram illustrating a mounting structure for a capacitor by use of a resin molded substrate according to a third embodiment of the present invention.
Figure 7:
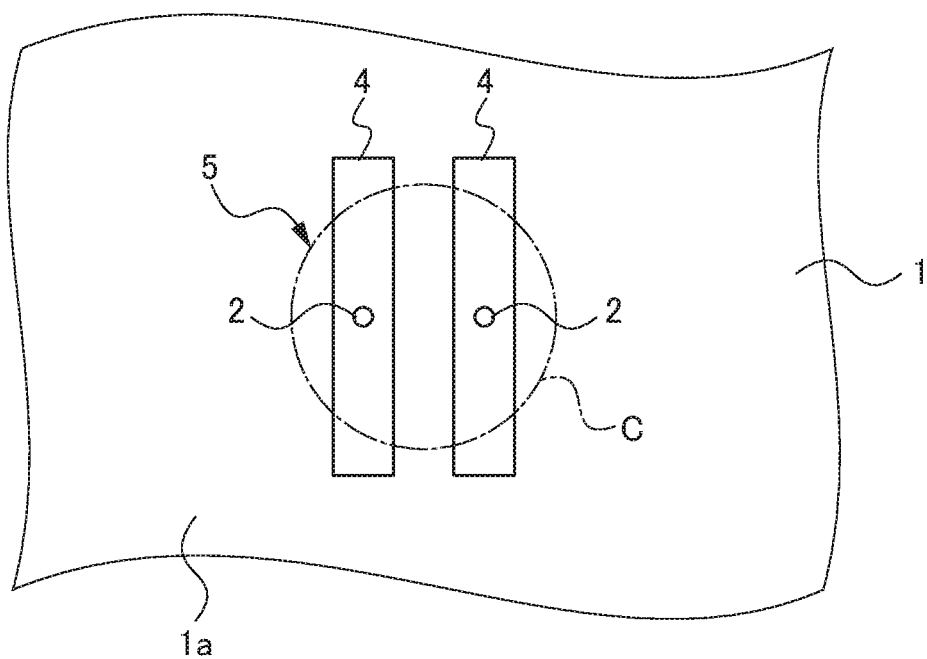
FIG. 7 is a partial plan view illustrating the resin molded substrate according to the third embodiment of the present invention.

FIG. 6 is a diagram illustrating a mounting structure for a capacitor by use of a resin molded substrate according to a third embodiment of the present invention. FIG. 7 is a partial plan view illustrating the resin molded substrate according to the third embodiment of the present invention. Since the portions imparted with the same reference numerals as those in FIG. 1 to FIG. 3 have the same configurations, the above descriptions of those are made reference to as the descriptions of the portions and such descriptions will be omitted in this part. The configurations different from those of the first embodiment and the second embodiment are described below. Although the resin molded substrate 1 according to the third embodiment has the pair of protrusions 4, 4, similarly to the first embodiment, the protrusions 4, 4 are disposed so as to overlap the terminal through holes 2, 2, respectively, and the terminal through holes 2, 2 penetrate the protrusions 4, 4. The protrusions 4, 4 extend mutually in parallel along the direction (vertical direction in FIG. 7) orthogonal to the arrangement direction (horizontal direction in FIG. 6 and FIG. 7) of the terminal through holes 2, 2.

The protrusions 4, 4 are also brought into contact with the peripheral portion C3 in the side of the bottom portion C1 of the capacitor C to be mounted on the resin molded substrate 1, thereby supporting the capacitor C. Therefore, the side of the bottom portion C1 of the capacitor C is spaced from the front surface 1a of the resin molded substrate 1 by a distance corresponding to the height of the protrusions 4, 4, whereby the space 5 is formed between the side of the bottom portion C1 of the capacitor C and the resin molded substrate 1.

In the present embodiment, the protrusions 4, 4 are exposed in the space 5 formed between the capacitor C and the resin molded substrate 1. Since the terminal through holes 2, 2 penetrate the protrusions 4, 4, respectively, the root portions of the lead terminals C2, C2 are not exposed between the capacitor C and the resin molded substrate 1, unlike the cases in the first embodiment and the second embodiment. Since the bottom portion C1 of the capacitor C is recessed more than the peripheral portion C3, the excessive solder S1 having overflowed from the terminal through holes 2, 2 is able to flow out from between the upper end surfaces of the protrusions 4, 4 and the bottom portion C1 of the capacitor C. FIG. 6 shows the state in which the excessive solder S1 having overflowed from the left terminal through hole 2 flows out. The excessive solder S1 flows out from the upper end surface of the protrusion 4 onto the front surface 1a of the resin molded substrate 1.

In the same way as the first embodiment and the second embodiment, this resin molded substrate 1 and this mounting structure for the capacitor C allows visual check of the presence/absence of the excessive solder S1 and the state of the solder S1 through observation of the peripheries of the protrusions 4, 4 exposed in the space 5. The terminal through holes 2, 2 are formed longer than those of the first embodiment and the second embodiment by a distance corresponding to the height of the protrusions 4, 4, thereby exerting the effect of suppressing the excessive solder S1 from overflowing on the front surface 1a of the resin molded substrate 1, as compared with the cases in the first embodiment and the second embodiment. The root portions of the lead terminals C2, C2 of the capacitor C are covered by the protrusions 4, 4, respectively, thereby suppressing a short circuit between the lead terminals C2, C2 caused by the excessive solder S1 having overflowed on the front surface 1a of the resin molded substrate 1, and easily securing insulation between the lead terminals C2, C2.

Figure 8A:
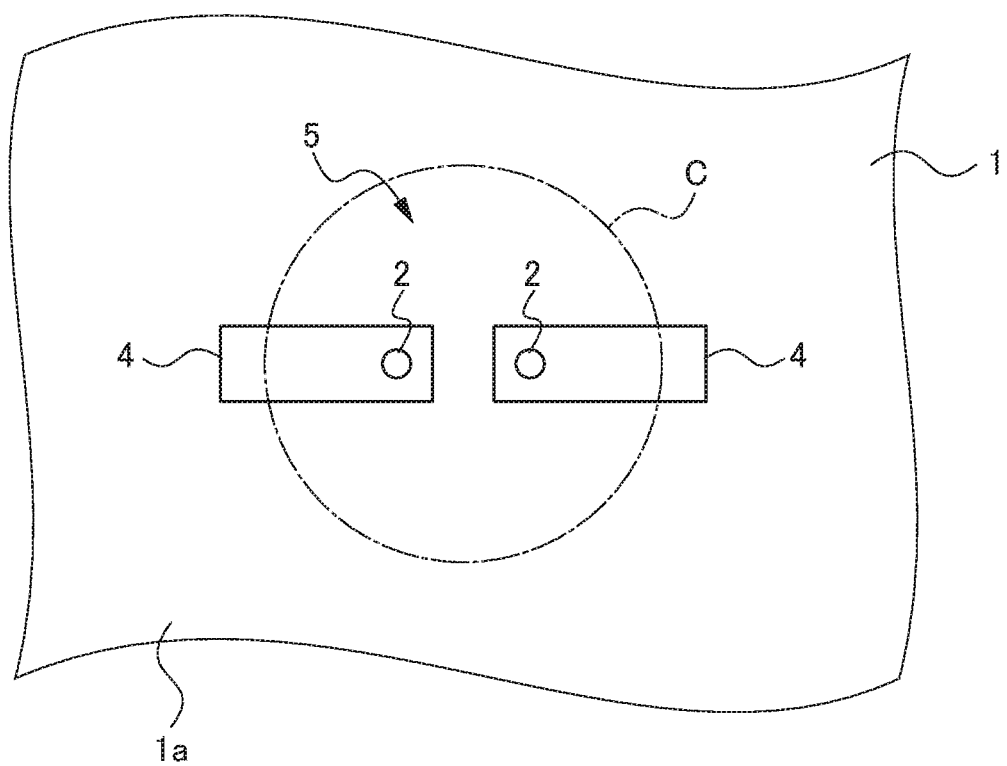
FIG. 8A is a partial plan view illustrating another form of the protrusions of the resin molded substrate according to the third embodiment of the present invention.
Figure 8B:
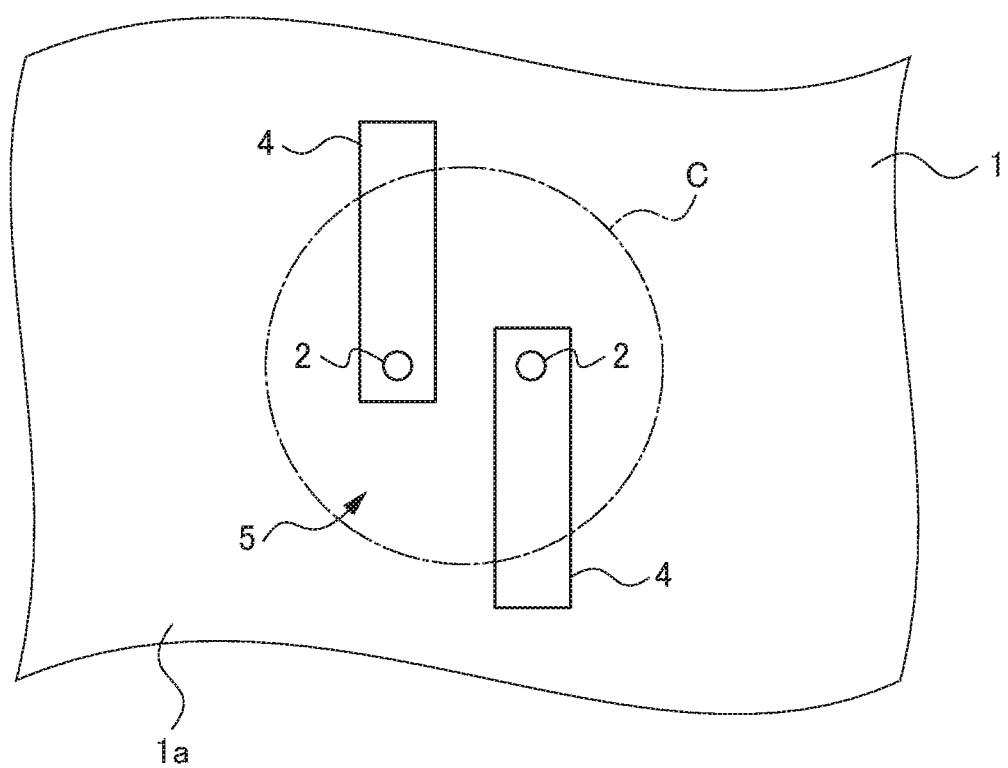
FIG. 8B is a partial plan view illustrating yet another form of the protrusions of the resin molded substrate according to the third embodiment of the present invention.
Figure 8C:
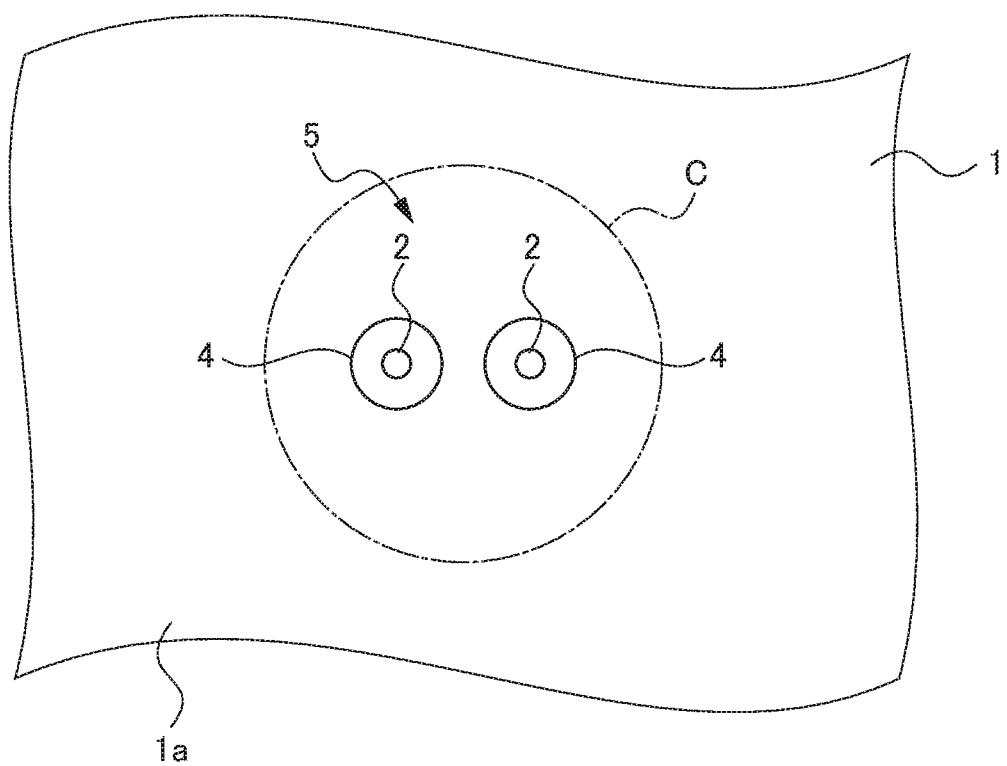
FIG. 8C is a partial plan view illustrating yet another form of the protrusions of the resin molded substrate according to the third embodiment of the present invention.
Figure 9:
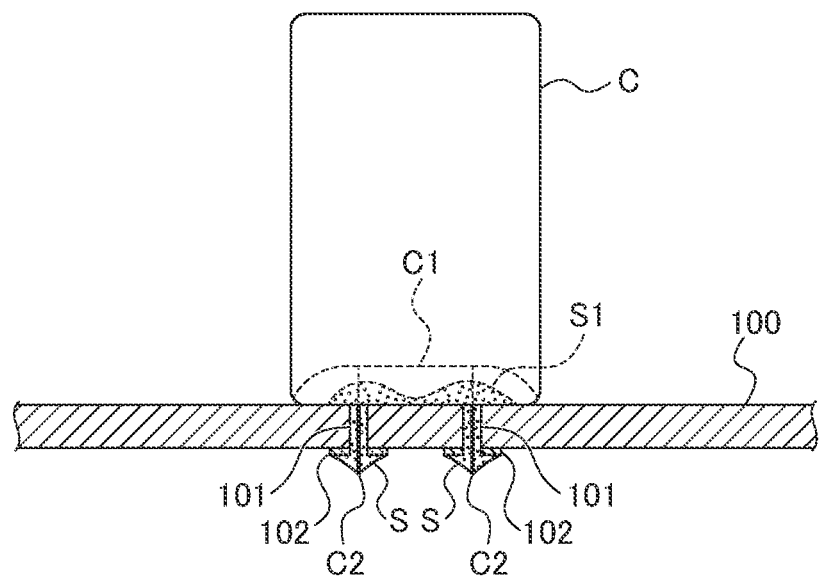
FIG. 9 is a diagram illustrating a conventional mounting structure for a capacitor.

The protrusions 4, 4 provided so as to respectively overlap the terminal through holes 2, 2 may be formed in various ways. In an example, as shown in FIG. 8A, one end of each of the protrusions 4, 4 may overlap the terminal through holes 2, 2, and the other ends of the protrusions 4, 4 may extend in mutually opposed directions along the arrangement direction (horizontal direction in FIG. 8A) of the terminal through holes 2, 2. Alternatively, as shown in FIG. 8B, one end of each of the protrusions 4, 4 may overlap the terminal through holes 2, 2, and the other ends of the protrusions 4, 4 may extend in mutually opposed directions along the direction orthogonal to the arrangement direction of the terminal through holes 2, 2. The pair of protrusions 4, 4 may not necessarily be parallel mutually. Alternatively, as shown in FIG. 8C, the protrusions 4, 4 may be disposed in dotted shapes only around the terminal through holes 2, 2.

The protrusion 4 according to the present embodiment may not necessarily be disposed corresponding to the pair of terminal through holes 2, 2. The protrusion 4 may be disposed corresponding to only either one of the pair of terminal through holes 2, 2.

In each of the embodiments described above, the protrusion 4 may be an integrally-formed portion which is molded integrally on the front surface 1a of the resin molded substrate 1. Since the protrusion 4 which is an integrally-formed portion is able to be easily molded simultaneously with the resin molded substrate 1, the manufacturing cost of the resin molded substrate 1 having the protrusion 4 is able to be lowered.

The upper end surface of the protrusion 4 is not limited to a flat surface. The upper end surface of the protrusion 4 may have, for example, a convex shape along the recession of the bottom portion C1 of the capacitor C. Alternatively, the protrusion 4 may be formed so as to be brought into line contact with the side of the bottom portion C1 of the capacitor C.

It is noted that, in the case where a plurality of capacitors C are mounted on the front surface 1a of the resin molded substrate 1, the protrusion 4 may support the plurality of capacitors C in common.

EXPLANATION OF REFERENCE NUMERALS

1 RESIN MOLDED SUBSTRATE
1a FRONT SURFACE
2 TERMINAL THROUGH HOLE
4 PROTRUSION
C CAPACITOR
C1 BOTTOM PORTION
C2 LEAD TERMINAL
C3 PERIPHERAL PORTION
S SOLDER

What is claimed is:

1. A resin molded substrate for allowing a cylindrical capacitor to be mounted in an upright state with a solder, the capacitor having a pair of lead terminals at a bottom portion, the resin molded substrate comprising:
    at least a pair of terminal through holes for allowing the lead terminals of the capacitor to be inserted through, respectively; and
    at least one protrusion for spacing the capacitor from a front surface of the substrate, the at least one protrusion contacting a bottom portion of the capacitor, the lead terminals of the capacitor being inserted through the terminal through holes, wherein
    the at least one protrusion is disposed so as to overlap at least one of the pair of terminal through holes, and
    a terminal through hole, among the at least a pair of terminal through holes, that is overlapped by the protrusion penetrates through the protrusion.

2. The resin molded substrate according to claim 1, wherein
    the at least one protrusion includes two separate protrusions,
    each protrusion of the two separate protrusions is disposed so as to overlap a respective one of the at least a pair of terminal through holes, and
    each terminal through hole that is overlapped by one of the two separate protrusions penetrates through the respective overlapping protrusion.

* * * * *